United States Patent
Hoenig et al.

(10) Patent No.: US 10,551,804 B2
(45) Date of Patent: Feb. 4, 2020

(54) TEST APPARATUS FOR CHECKING A BATTERY CONTROL DEVICE OR A BATTERY, AND METHOD FOR TESTING A BATTERY CONTROL DEVICE OR A BATTERY

(71) Applicant: Robert Bosch GmbH, Stuttgart (DE)

(72) Inventors: Guenter Hoenig, Ditzingen (DE); Bernhard Mattes, Sachsenheim (DE); Manuel Roth, Claw (DE); Robert Thomas, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 318 days.

(21) Appl. No.: 15/535,491

(22) PCT Filed: Nov. 27, 2015

(86) PCT No.: PCT/EP2015/077886
§ 371 (c)(1),
(2) Date: Jun. 13, 2017

(87) PCT Pub. No.: WO2016/096371
PCT Pub. Date: Jun. 23, 2016

(65) Prior Publication Data
US 2017/0351225 A1  Dec. 7, 2017

(30) Foreign Application Priority Data
Dec. 17, 2014 (DE) .................. 10 2014 226 190

(51) Int. Cl.
*G01R 31/396* (2019.01)
*G05B 13/04* (2006.01)
(Continued)

(52) U.S. Cl.
CPC ......... *G05B 13/041* (2013.01); *G01R 31/367* (2019.01); *G01R 31/396* (2019.01);
(Continued)

(58) Field of Classification Search
CPC .. G01B 13/041; H01M 10/486; G01R 31/396
(Continued)

(56) References Cited

U.S. PATENT DOCUMENTS

| 2009/0024266 A1* | 1/2009 | Bertness | B60L 3/0046 701/22 |
| 2012/0119765 A1* | 5/2012 | Bracker | H01M 10/42 324/750.01 |
| 2015/0357852 A1* | 12/2015 | Nakao | B60L 58/16 320/162 |

FOREIGN PATENT DOCUMENTS

| CN | 103941210 | 7/2014 |
| DE | 102007007268 | 8/2008 |
| DE | 102011054370 | 1/2012 |

OTHER PUBLICATIONS

International Search Report for Application No. PCT/EP2015/077886 dated Mar. 23, 2016 (English Translation, 3 pages).
(Continued)

Primary Examiner — Reena Aurora
(74) Attorney, Agent, or Firm — Michael Best & Friedrich LLP

(57) ABSTRACT

The invention relates to a test apparatus for checking a battery control device or for checking a battery having at least one cell, comprising a battery simulator (18) for simulating a voltage of at least one cell of a simulated battery for specification on the battery control device, wherein the battery control device or the battery is connected to an evaluation module (14) via a rail designed as a central bus in order to process and check the voltage of a selected cell, wherein the selected cell of the battery simulator for the battery control device or the selected cell of the battery can be selected via a separation module (24). In this way, a test apparatus for checking a battery control device or for checking a battery can be provided, which has a simple (Continued)

10 - VOLTAGE SUPPLY
12 - CONSTANT CURRENT MODULE
14 - EVALUATION MODULE
16 - RESISTOR NETWORK
18 - BATTERY SIMULATOR
20 - TEMPERATURE MODULE
22 - RELAY MODULE
24 - ISOLATING MODULE
26 - CONTROL MODULE
28 - EXTERNAL OPERATING ELEMENT
30 - TEST MODULE construction and can check all of the cells of a simulated or actual battery in a simple manner.

10 Claims, 1 Drawing Sheet

(51) Int. Cl.
    *G01R 31/367*     (2019.01)
    *H01M 10/48*     (2006.01)
    *H01M 10/42*     (2006.01)

(52) U.S. Cl.
    CPC ..... *H01M 10/4207* (2013.01); *H01M 10/482* (2013.01); *H01M 10/486* (2013.01)

(58) Field of Classification Search
    USPC .......................................................... 324/425
    See application file for complete search history.

(56) References Cited

OTHER PUBLICATIONS

"Zellspannungsemulation: Spannung garantiert Hochgenaue Zellspannungsemulation mit dem dSpace HIL-Simulator," Internet Citation, Mar. 1, 2010, pp. 40-45 XP002679139, Retrieved from the Internet <URL: http://www.dspace.com/shared/data/pdf/2011/dSPACE-Magazine-2010-03_Batterie_D.pdf>.

Wai, C., et al., "Development of a Hardware-in-the-Loop Simulation System for Testing Cell Balancing Circuits," IEEE Transactions on Power Electronics, Institute of Electrical and Electronics Engineers, USA, vol. 28, No. 12, Dec. 1, 2013, pp. 5949-5959, XP011514361.

Sajjad Haidar et al., Use a photoelectric-FET optocoupler as a linear voltage-controlled potentiometer, Jan. 19, 2012, XP055255546, Retrieved from the Internet <URL: http://ww.edn.com/Pdf/ViewPdf?contentItemId=4368893>.

* cited by examiner

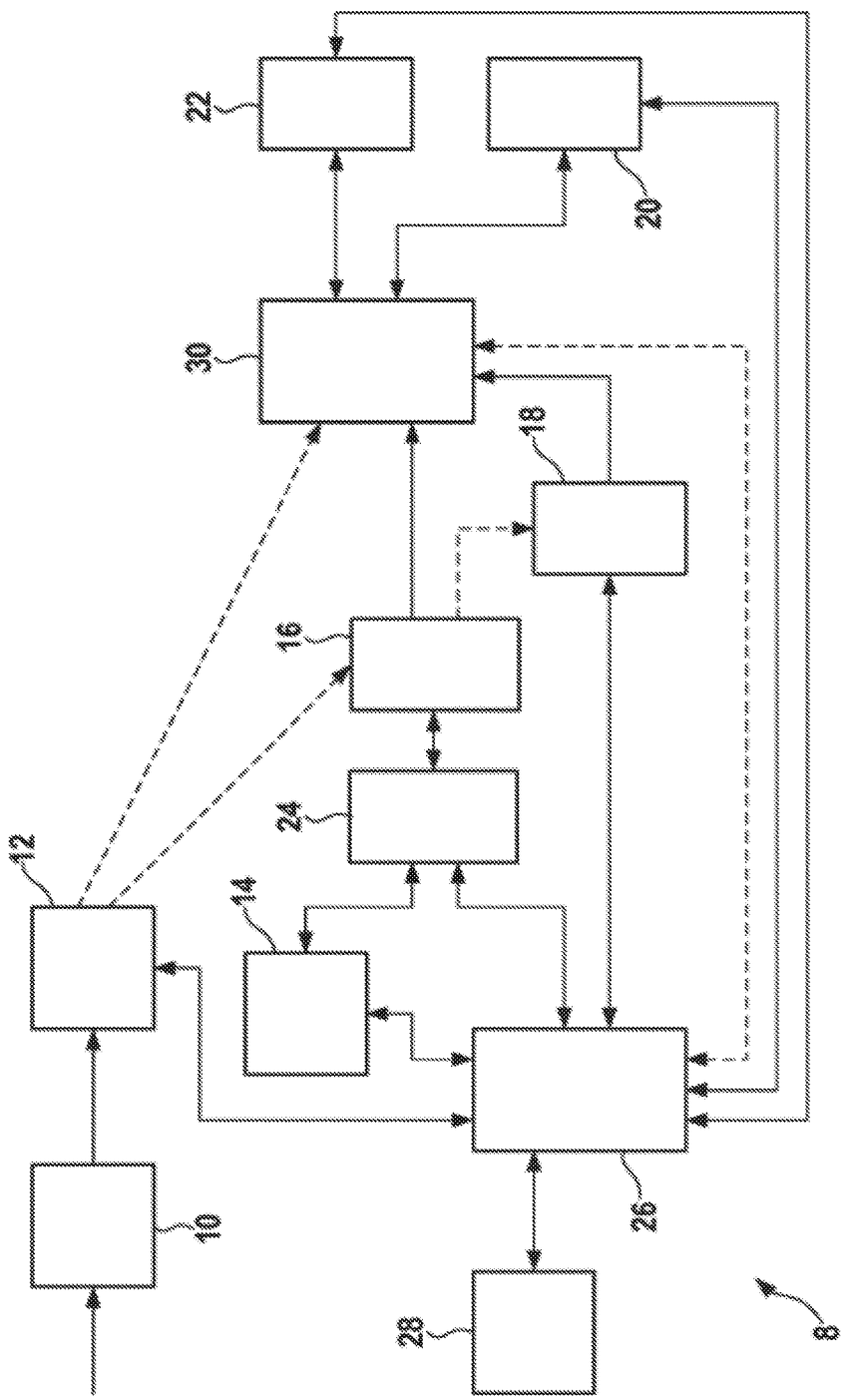

TEST APPARATUS FOR CHECKING A BATTERY CONTROL DEVICE OR A BATTERY, AND METHOD FOR TESTING A BATTERY CONTROL DEVICE OR A BATTERY

BACKGROUND OF THE INVENTION

The invention relates to a test apparatus for checking a battery control device or a battery, and to a method for testing a battery control device or a battery.

In the motor vehicle industry, electric drives, in particular in electric or hybrid vehicles, are becoming increasingly significant. These electric drives comprise a battery. The battery is monitored by a battery control device. Before installation in electric or hybrid vehicles, the battery and the battery control device must be tested.

In practical application, automated test stands are utilized for generating test cases, configuring the test stand, carrying out the test, and evaluating the test. This includes the HIL standard, which is an acronym for the "hardware-in-the-loop" standard. In an HIL test system, at least one real component is connected to a simulator.

However, the devices used in an HIL standard have a complex design and are heavy and voluminous, and are not sufficiently mobile for a battery-electronics test in the field.

The problem addressed by the invention is therefore that of providing a test apparatus for checking a battery control device, which has a simple design and can check all the cells of a simulated or real battery in a simple manner.

The problem is solved by a test apparatus according to the invention, and by a method according to the invention. Embodiments of the invention are described in the description which follows, and can depict one aspect of the invention either individually or in combination.

SUMMARY OF THE INVENTION

According to the invention, a test apparatus for checking a battery control device or for checking a battery having at least one cell comprises a battery simulator for simulating a voltage of at least one cell of a simulated battery for specification to the battery control device, wherein the battery control device or the battery is connected to an evaluation module via a rail designed as a central bus in order to process and check the voltage, temperatures, and further quantities of a selected cell, wherein the selected cell of the battery simulator for the battery control device or the selected cell of the battery can be selected via an isolating module.

Depending on the test mode of the test apparatus, a battery can be simulated in the test apparatus in order to test a battery control device or a real battery.

By means of such a design, a simple, mobile test apparatus can be provided for checking a battery control device. The battery control device can be a battery control and supervision unit (BCSU). The battery control unit can comprise at least one monitoring device, in particular at least one CSC chip. The abbreviation CSC stands for "cell supervision unit". A cell supervision unit (CSC) monitors the individual cells and ensures that they interact. The CSC balances the state of charge of all cells in the battery with respect to one another in order to ensure that the cells are not loaded to different extents for a long period of time. Due to the use of a battery simulator, the supply voltages can be made available for the monitoring device of the battery control device. In this case, the battery simulator can simulate individual cells of a battery and forward the corresponding measured quantities, such as supply voltages, to the monitoring device, so that the monitoring device can check and process the simulated cells. In addition, the supply voltage and supply currents of the monitoring device can be measured via the battery simulator and can be processed via the evaluation module. The battery simulator is not used, however, but rather is switched off when a battery is supposed to be tested in the test apparatus.

The rail designed as a central bus is, in particular, a central voltage rail. The term "bus" describes a system for transferring voltage, temperature, data, and further quantities between multiple participants via a shared transmission path, wherein the participants are not involved in the transmission between other participants. The term "central voltage rail" describes a so-called rail comprising rail+ and rail−, to which the individual cells of the battery simulator or the battery can be connected and, in this way, can be connected to the evaluation module in order to be processed and checked by the evaluation module. In this case, the individual cells of the battery simulator or the battery can be selected via an isolating module having individual isolating stages, so that an operation can be carried out by the evaluation module. By means of the isolating module, the evaluation module can connect to a selected cell of the battery simulator or the battery, and therefore the cell voltage potential is identical to that of the voltage rail, in particular to that of the rail+ potential and the rail− potential.

By means of the evaluation module, different variants of the adjustment, monitoring and processing any cell of a battery simulator or battery selected via the isolating module can be carried out. In terms of implementation, the evaluation module can operate according to a floating ground concept. In this case, all data from a selected cell are captured, controlled, and manipulated by the evaluation module. The decisive aspect of this concept is that the feedback can be compared via a setpoint-actual value comparison and the cell can be correctly controlled in accordance with the values. The reference point can be located at the negative pole of the selected cell. In this case, the evaluation module in a battery control device test can carry out a cell voltage specification with voltage feedback and can carry out a test of the balancing current for the selected cell with current, for example 100 mA, and a current measurement. In a battery test, the evaluation module can test a measurement of the cell voltages and can test the balancing current using current specifications. In addition, further quantities such as a temperature can be detected via the bus by means of a suitable expansion via switches.

In this way, a test apparatus for checking a battery control device or for checking a battery can be provided, which has a simple design and can check all the cells of a simulated or real battery in a simple manner.

In particular, the test apparatus can be supplied with a specifiable voltage via a voltage supply module. The voltage supply module can provide, in particular, a voltage for the battery control device, for example 48 V. In addition, the voltage supply module can provide a general voltage supply for the remaining digital modules of the test apparatus, for example, a voltage of 5 V.

In one preferred embodiment, the processing and checking by the evaluation module can be coordinated via a control module. The control module can comprise a central computer, in particular a microcontroller. The central computer functions as a control and communication unit and can receive measured values from all modules of the test apparatus and can send commands for processing to the modules.

In this way, a separate central processing unit for each individual module can be dispensed with. The communication by the evaluation module with the central computer can take place via optocouplers. The central computer can function as the coordinator and can establish the test sequence. For example, the actual value determined by the battery control unit can be transmitted to the central computer via CAN, i.e., a controller area network. CAN is a serial bus system and belongs to the field busses.

It is preferred that a voltage of a selected cell of the battery simulator or the battery can be changed via a resistor network having at least one controllable optical field effect transistor. In particular, by means of the at least one controllable optical field effect transistor, a selective change of a simulated cell resistance can take place by utilizing a resistance characteristic curve of the optical field effect transistor. With the aid of the optical field effect transistor (optical-coupled MOS FET), the cell voltage of a selected cell can be adjusted in a simple way. By means of feedback via the central computer, a regulation to the desired resistance and, therefore, the voltage value can be carried out for any cell. The resistor network can be supplied with current with the aid of a constant-current module. A cell voltage of a selected cell can be individually changed by means of the resistor network. The current value and, therefore, the supply voltage for the battery control device can be specified by the central computer of the control module. The cell voltage can take place via a drop in resistance at resistors in conjunction with a current supply. During a battery test, the resistor network is decoupled from the constant-current module. The resistor network receives the voltage from the battery instead.

It is preferred that a value for a balancing current in the charging direction of the cell or in the discharging direction of the cell can be specified via the evaluation module, wherein the evaluation module can control the balancing current for each cell of the battery simulator for the battery control device or for each cell of the battery, independently of an adjacent cell. The balancing current ensures, in a battery, in particular in a battery pack of a rechargeable battery, that the cells all have a uniform voltage. In order to increase the nominal voltage, batteries usually consist of multiple series-connected individual cells or cell blocks. For production-related reasons, there are fluctuations in the capacitance and the internal resistance of these cells. In the practical use of multi-cell, series-connected batteries, this situation results in the cells being discharged and charged differently and being capable of assuming critical states of charge. In this case, the different voltage levels of the individual cells within a series interconnection during discharge result in the danger of the total discharge of individual cells. Series-connected cells also do not reach the same final voltage of charging when they are jointly charged, which can result in individual cells being overcharged. Given that the evaluation module can control the balancing current for each cell of the battery simulator or the battery cell independently of an adjacent cell, different balancing methods can be implemented by the adjusting device by means of current specifications. For example, the adjusting device can forward the balancing current to the subsequent cell in accordance with the specification of the battery control device, and therefore the balancing current always flows through the entire battery or through the entire battery simulator. In addition, a selective balancing method can be applied, and therefore the current can be drawn from a predetermined cell and forwarded directly to other selected cells, without involving adjacent cells or other cells during the balancing process.

In one preferred embodiment, the evaluation module comprises a capacitor for the intermediate storage of a voltage for the balancing current. In this way, the balancing function can be expanded. As a result, a balancing for each cell can be carried out selectively, independently of the adjacent cell. An additional charging or discharging can take place via a capacitor. For example, an additional charging to a higher voltage level can take place via a DC/DC converter, in order to achieve a higher storage capacity and a high voltage for balancing.

Preferably, the evaluation module can be connected to a temperature module for detecting at least one temperature measured by the battery control device or a temperature of at least one cell of the battery. The cell temperature can take place, in this case, either via individual modules, in particular temperature sensors, each of which individually measures the temperatures of each cell and forward this to the evaluation module. In addition, a temperature simulation can correspond to a resistance change, which take place via optical field effect transistors in order to simulate the cell voltage. Feedback of the current value of the optical field effect transistors to the evaluation module always takes place in this case.

It is preferred that the test apparatus comprises a matrix for assigning a supply voltage for the monitoring device. In this way, any cell distribution configuration can be implemented with the aid of the monitoring device. With the aid of a matrix, a decoupling of the current supply of the CSC chips in the battery control device can be made possible, whereby no reaction by a withdrawn current to the cell voltages can take place. The CSC supply voltages and the supply currents can be measured and transmitted to the central computer.

Preferably, a specification of any temperatures for selected cells as voltage or resistance values with feedback is made possible by the evaluation module. In particular, the evaluation module can establish a selection connection to the temperature module via a relay. A selection with a temperature specification can take place in such a way that the evaluation unit assigns a temperature to a selected cell via changeable voltage or resistance values, while the non-selected cells are assigned a voltage via a fixed resistance. By means of the feedback of the values, the evaluation unit can adjust the temperature for the selected cell by changing a voltage or resistance. In this case, the evaluation unit can be controlled using an associated voltage level.

In one preferred embodiment, the test apparatus comprises a communication unit for communication with an external operating element. The communication unit can be a Bluetooth interface, a wireless LAN network, or an external CAN. A wireless LAN network is a local radio network. The test apparatus can be globally controlled with the aid of the external operating element. In this way, the test system can be designed to be compact, because it is not necessary to fixedly connect external operating elements to the test apparatus. In addition, the test apparatus can be disposed at a distance from the external operating element, and therefore, for example, the operating element and the test apparatus can be disposed in two different rooms. The data from the test apparatus can also be evaluated with the aid of the external operating element.

In addition, the invention relates to a method for testing a battery control device or for testing a battery in a test apparatus which is refined or designed as described above, including the following steps of:

connecting a battery control device to the test apparatus or connecting a battery having at least one cell to the test apparatus; and processing or checking the battery control device or the battery via an evaluation module of the test apparatus.

In this way, a method comprising a test apparatus for checking a battery control device or for checking a battery can be provided, wherein the test apparatus has a simple design and can check all the cells of a simulated or real battery in a simple manner.

In one preferred embodiment, the method includes the following step of:

adjusting a balancing current for at least one selected cell of the battery simulator or the battery independently of an adjacent cell.

BRIEF DESCRIPTION OF THE DRAWINGS

The invention is explained in the following, by way of example, with reference to the attached figures and on the basis of preferred exemplary embodiments, wherein the features presented in the following can depict an aspect of the invention individually or in different combinations with one another. In the drawings:

FIG. 1 shows a schematic drawing of a test apparatus.

DETAILED DESCRIPTION

FIG. 1 shows a schematic drawing of a test apparatus 8, to which a test module 30 is connected. The test apparatus 8 is depicted in FIG. 1 as a schematic modular drawing. The individual modules of the test module are depicted as blocks. The test module 30 is intended to depict either a battery control device or a battery which is supposed to be tested by the test apparatus 8. The test apparatus 8 comprises an evaluation module 14, a resistor network 16, a battery simulator 18, a temperature module 20, a relay module 22, an isolating module 24, and a control module 26. In addition, the test module comprises a non-illustrated central voltage rail, a so-called rail comprising rail+ and rail−, to which the individual cells of the battery simulator or the battery can be connected and, in this way, are connected to the evaluation module 14, in order to be processed and checked by the evaluation module 14.

The test apparatus 8 is supplied with current with the aid of a voltage supply 10 and a constant-current module 12. The constant-current module 12 is supplied with a voltage and with current via the voltage supply module 10. This is indicated by an arrow from the voltage supply module 10 to the constant-current module 12. The module 12 likewise delivers the supply voltage for the battery control device 30.

The voltage supply module 10 is supplied with a voltage of 7 volts to 19 volts with the aid of an external power supply unit. This is indicated by an arrow. With the aid of the voltage supply module 10, a battery control device having a basic voltage according to a battery simulator is supplied with a battery pack voltage specified by the control module 26. In addition, the voltage supply module 10 supplies the remaining digital modules with a voltage of 5 V. The supply voltage 10 can also provide a voltage of 1.5 V for optocouplers for the through-switching of signals from the isolating module 24.

The constant-current module 12 generates a constant current for the resistor network 16. In addition, the total current of a battery control device can be measured with the aid of the constant-current module 12. The constant-current module 12 is controlled by means of a central computer of the control module 26. The constant-current module 12 can comprise a switching module to enable different test modes to be carried out using the test apparatus 8. The different test modes are a pure test mode for the battery control device by supplying constant current, or a test mode for the battery, wherein in this case, the resistor network 16 and the test module 30 are separated from the voltage supply by the constant-current module 12. The relationships of the constant-current module 12 with the resistor network 16, the adjusting device 26, and the battery control device 30 are depicted as arrows. The dashed arrow between the constant-current module 12 and the test module 30 is supposed to illustrate that the constant-current module 12 provides a voltage to the resistor network 16 and the test module 30 only during a battery control device test. During a battery test, the individual cells of the battery provide the voltage.

Both the battery control device and, simultaneously, the battery can be connected via separate connectors to a change-over via a relay for disconnection from the resistor network 16.

The evaluation module 14 has various different variants for adjusting and monitoring any cell of a battery simulator or battery selected via the isolating module 24. Essential to the implementation is the floating ground concept for the detection, control, and manipulation of the selected cell. The evaluation module 14 can operate according to a floating ground concept. In this case, all data from a specified cell are captured, controlled, and manipulated by the evaluation module 14. The decisive aspect of this concept is that the feedback can be compared via a setpoint-actual value comparison, and the cell can be correctly controlled in accordance with the values. The reference point can be located at the negative pole of the selected cell. The communication of the evaluation module 14 with the central computer of the control module 26 takes place via optocouplers. The central computer of the control module 26 functions as a coordinator and specifies the test sequence. The actual value ascertained by the test module 30 is transmitted to the central computer via CAN. This is depicted in FIG. 1 as a dashed arrow between the control module 26 and the test module 30. The evaluation module 14 makes it possible, during a battery control device test, to specify a cell voltage with voltage feedback and a test balancing of a cell with a current, for example, 100 mA, and to measure current. During a battery test, the evaluation module 14 makes it possible to measure the individual cells of the battery and to implement different balancing methods with current specification. Either the current is forwarded to the subsequent cell, and so the current flows through all the cells of the battery, or selective balancing takes place, and so the current is drawn from a predetermined cell and is supplied to a further specified cell. With the aid of the evaluation module 14, the current of a cell is measured both during the withdrawal and during the supply. In one alternative embodiment, the evaluation module 14 comprises a microcontroller for carrying out the operations. The evaluation module 14 is connected to the control module 26 with the aid of a serial peripheral interface (SPI). In this way, the interfaces between the evaluation module 14 and the control module 26 are reduced, and an evaluation of the measured values takes place directly in the evaluation module 14. In one further embodiment of the evaluation module 14, the evaluation module 14 comprises a capacitor for the intermediate storage of a voltage. The balancing function can therefore be expanded, whereby the balancing can be carried out selectively for each cell, independently of the adjacent cell. In addition, a charging and discharging also takes place by way of the capacitor. The charging takes place by way of a DC/DC converter to a higher level, in order to achieve a higher storage capacity and a high voltage for balancing. The relationships between the evaluation module 14, the control module 26, and the isolating module 24 are depicted in FIG. 1 as double arrows.

The resistor network 16 is supplied with current via the constant-current module 12. As a result, a voltage of a cell of a battery simulator or a battery can be changed without changing the voltages of the other cells. The current value itself can be specified and monitored by a central computer of the control module 26. The voltage for the individual cells can be generated via a voltage drop at resistors in conjunction with a current supply in the resistor network 16. The resistance control takes place between two adjacent connectors in the resistor network 16, in order to reduce a cell voltage. The change takes place via optocouplers in this case. Voltage feedback takes place by means of the evaluation module 14 with selection of the cell to be considered via the isolating module 24. The relationships of the resistor network 16 with the constant-current module 12, the battery simulator 18, and the isolating module 24 are depicted in FIG. 1 as arrows.

The battery simulator 18 makes it possible to select voltages of the resistor network 16 having downstream optocouplers for supplying the CSC chips in the battery control device. As a result, there is no reaction by the withdrawn current to the cell voltage. The CSC supply voltage and supply currents are measured and are transmitted to the central computer in the control module 26. The voltage for the CSC chips is implemented in the battery simulator 18 via a matrix having a crosspoint structure. In this case, horizontal lines represent the cell voltages and the intersecting, vertical lines represent the supply of the CSC chips. In addition, the voltage selector 18 comprises an operational amplifier for supplying the CSC chips. The relationships of the battery simulator 18 with the resistor network 16, the control module 26, and the test module 30 are depicted in FIG. 1 as arrows.

The temperature module 20 is used for simulating the temperature of the test module 30. In this case, two alternative embodiments are possible. In one first embodiment, the temperature detection is carried out by individual modules, each of which individually measures the temperatures of each cell and forwards these to the control module 26. In one further embodiment, the temperature simulation takes place via a change in resistance, which takes place via optical field effect transistors for simulating the cell voltage. In this case, a feedback of the current value of an operational amplifier to the control module 26 always takes place. The relationships of the temperature module 20 with the test module 30 and the control module 26 are depicted in FIG. 1 as double arrows.

The starting of the engine of the motor vehicle and the charging of the battery of the motor vehicle are simulated with the aid of the relay module 22. The signals for the simulation come either via a hardware switch, via a microcontroller having the signals "start" and "charge" or directly from a connected vehicle. In addition, the relay module 22 can comprise a relay which displays the simulation of starting and charging via an LED display and forwards a feedback to the control module 26. The relationships of the relay module 22 with the test module 30 and the control module 26 are depicted in FIG. 1 as double arrows.

The isolating module 24 comprises individual isolating stages and is disposed between the evaluation module 14 and the resistor network 16. Via the isolating module 24, any cell of a battery simulator or a battery can be connected to the evaluation module 14, and therefore the cell voltage potential is identical to the rail+ potential and the rail− potential. The remaining cell voltages are not influenced as a result. The relationships between the isolating module 24, the evaluation module 14, the resistor network 16, and the control module 26 are depicted as double arrows.

The control module 26 comprises a central computer. The central computer is a microcontroller. The control, monitoring, and communication of the test apparatus 8 with the other modules takes place with the aid of the control module 26. The control module 26 functions as a control and communication unit of the test apparatus 8. The control module 26 comprises a communication unit for communication with the external operating element 28 via WLAN or Bluetooth. The relationships between the control module 26, the constant-current module 12, the evaluation module 14, the battery simulator 18, the temperature module 20, the relay module 22, the isolating module 24, the external operating module 28, and the test module 30 are depicted in FIG. 1 as arrows.

The external operating element 28 can be a tablet PC, an external computer, a smartphone, or another operating element which can connect wirelessly to the control module 16 via WLAN or Bluetooth.

The test module 30 is either the battery control device to be tested or the battery to be tested.

The invention claimed is:

1. A test apparatus for checking a battery control device or for checking a battery having at least one cell, comprising a battery simulator (18) for simulating a voltage of at least one cell of a simulated battery for specification of the battery control device, characterized in that the battery control device or the battery is connected to an evaluation module (14) via a rail designed as a central bus in order to process and check the voltage of a selected cell, wherein the selected cell of the battery simulator (18) for the battery control device or the selected cell of the battery is selected via an isolating module (24); and wherein a voltage of a selected cell of the battery simulator or the battery is changed via a resistor network (16) having at least one controllable optical field effect transistor.

2. The test apparatus as claimed in claim 1, characterized in that the processing and checking by the evaluation module (14) is coordinated via a control module (26).

3. The test apparatus as claimed in claim 2, characterized in that the evaluation module (14) is connected to a temperature module (20) for detecting at least one temperature measured by the battery control device or a temperature of at least one cell of the battery.

4. The test apparatus as claimed in claim 1, characterized in that a value for a balancing current in the charging direction of the cell or in the discharging direction of the cell is specified via the evaluation module (14), wherein the evaluation module (14) controls the balancing current for each cell of the battery simulator (18) for the battery control device or for each cell of the battery, independently of an adjacent cell.

5. The test apparatus as claimed in claim 1, characterized in that the evaluation module (14) comprises a capacitor for the intermediate storage of a voltage for a balancing current.

6. The test apparatus as claimed in claim 1, characterized in that the battery simulator (18) has a matrix for assigning a supply voltage for the monitoring device of the battery control device.

7. The test apparatus as claimed in claim 1, characterized in that a specification of temperatures for selected cells as voltage or resistance values with feedback is generated by the evaluation module (14).

8. The test apparatus as claimed in claim 1, characterized in that a control module (26) comprises a communication unit for communication with an external operating element.

9. A method for testing a battery control device or for testing a battery in a test apparatus having a battery simulator (18) for simulating a voltage of at least one cell of a simulated battery for specification of the battery control device, wherein the battery control device or the battery is connected to an evaluation module (14) via a rail designed as a central bus in order to process and check the voltage of a selected cell, including the following steps of:

connecting the battery control device to the test apparatus or connecting a battery having at least one cell to the test apparatus; and processing or checking the battery control device or the battery via the evaluation module (14) of the test apparatus;

wherein the selected cell of the battery simulator (18) for the battery control device or the selected cell of the battery is selected via an isolating module (24); and wherein a voltage of a selected cell of the battery simulator or the battery is changed via a resistor network (16) having at least one controllable optical field effect transistor.

10. The method as claimed in claim 9, further comprising the following step of:

adjusting a balancing current for at least one selected cell of the battery simulator (18) or the battery, independently of an adjacent cell.

* * * * *